United States Patent [19]

Amann et al.

[11] Patent Number: 4,963,507
[45] Date of Patent: Oct. 16, 1990

[54] METHOD AND MANUFACTURING A LASER DIODE WITH BURIED ACTIVE LAYER

[75] Inventors: Markus-Christian Amann; Wolfgang Thulke, both of Munich; Gerhard Baumann, Ottobrunn, all of Fed. Rep. of Germany

[73] Assignee: Siemens Aktiengesellschaft, Berlin and Munich, Fed. Rep. of Germany

[21] Appl. No.: 186,799

[22] Filed: Apr. 27, 1988

[30] Foreign Application Priority Data

Apr. 30, 1987 [DE] Fed. Rep. of Germany ....... 3714522

[51] Int. Cl.[5] .................. H01L 21/20; H01L 21/208
[52] U.S. Cl. .................... 437/130; 437/122; 437/129; 437/133; 437/905; 148/DIG. 101; 148/DIG. 99
[58] Field of Search ............. 437/122, 129, 130, 133, 437/905; 29/569.1; 148/DIG. 99, DIG. 101

[56] References Cited

U.S. PATENT DOCUMENTS

| | | | |
|---|---|---|---|
| 4,142,924 | 3/1979 | Hsieh | 437/122 |
| 4,366,569 | 12/1982 | Hirao et al. | 437/129 |
| 4,372,791 | 2/1983 | Hsieh | 437/130 |
| 4,404,730 | 9/1983 | Heimen | 437/122 |
| 4,464,211 | 8/1984 | Logan et al. | 437/122 |
| 4,496,403 | 1/1985 | Turley | 437/129 |
| 4,566,171 | 1/1986 | Nelson et al. | 437/129 |
| 4,569,721 | 2/1986 | Hayakawa et al. | 437/129 |
| 4,648,940 | 3/1987 | Menigaux et al. | 437/129 |
| 4,662,983 | 5/1987 | Chin | 437/122 |
| 4,818,722 | 4/1989 | Heinen | 437/129 |
| 4,849,373 | 7/1989 | Knight et al. | 437/129 |

FOREIGN PATENT DOCUMENTS

| | | | |
|---|---|---|---|
| 0074285 | 6/1977 | Japan | 437/133 |
| 0162288 | 12/1980 | Japan | 437/133 |
| 0142691 | 11/1981 | Japan | 437/133 |
| 0077486 | 5/1985 | Japan | 437/129 |
| 0090926 | 4/1987 | Japan | 437/133 |
| 0199021 | 9/1987 | Japan | 437/133 |
| 0058923 | 3/1988 | Japan | 437/133 |

OTHER PUBLICATIONS

Hirao et al., "Fabrication and Characterization of Narrow Stripe InGaAsP/InP Buried Heterostructure Lasers", J. Appl. Phys., vol. 51, No. 8, Aug. 1980, pp. 4539-4540.

K. Nakajima et al., Liquid Phase Epitaxial Growth Conditions of Lattice-Matched $In_{l-x}Ga_xAs_{1-y}P_y$ Layers on (III)A and (III)B InP, Journal of Crystal Growth 71 (1985), pp. 463-469.

M. A. DiGiuseppe et al., The Effect of Melt-Carry-Over on the LPE Growth of Planar Buried InGaAsP/InP Double Heterostructures, Journal of Crystal Growth 67 (1984), pp. 1-7.

G. Winstel et al., Optoelektronik 1, Springer-Verlag, Berlin, Heidelberg, New York 1980, pp. 225-232.

Primary Examiner—Olik Chaudhuri
Assistant Examiner—M. Wilczewski
Attorney, Agent, or Firm—Hill, Van Santen, Steadman & Simpson

[57] ABSTRACT

In the manufacture of laser diodes having a stripe-shaped, active layer, a problem arises upon application of lateral layers, particularly of blocking pn-junctions for lateral current conduction, in that these layers are undesired above the active layer. By applying a protective cover layer that will dissolve in super-cooled melts of the material of the lateral layers, before the growth of the lateral layers, the growth of the lateral layers, particularly blocking pn-junctions, above the active stripe is avoided since the cover layer dissolves in the melt given epitaxial application of the lateral layers.

15 Claims, 3 Drawing Sheets

METHOD AND MANUFACTURING A LASER DIODE WITH BURIED ACTIVE LAYER

BACKGROUND OF THE INVENTION

The present invention relates to a method for manufacturing a laser diode with a buried active layer.

It is known to manufacture laser diodes with low threshold currents and high output power as a laser diode having a double hetero layer structure and a buried active layer (see, for example, G. Winstel, C. Weyrich, Optoelektronik 1, Springer Verlag, Berlin, Heidelberg, New York 1980, pages 225 through 232). The active layer is embedded in the form of a stripe in a semiconductor material that has a lower refractive index and a higher energy band gap than the material of the active layer. Due to the different cut-off voltages of the homo-pn junctions at the side of the active layer and of the hetero-pn junction of the active layer, the current essentially flows over the active layer.

To improve the lateral current conduction at least one blocking pn-junction is respectively arranged at the side of the active layer. These blocking pn-junctions are usually integrated in a second epitaxial process, whereby the method is designed such that no such blocking junction is obtained above the active laser stripe.

It is known to prevent the growth of a blocking junction on the active stripe by applying masking layers such as, for example, $SiO_2$ or on the basis of the selection of the profile of the active stripe, whereby what is thereby exploited is that no crystal growth ensues on the surface of the stripe on specific crystal faces or given specific relationships of height and width of the stripe. A further possibility is to initially grow the blocking pn-junction over the active stripe as well and to then render it conductive again by selective diffusion. Masking layers such as, for example, $SiO_2$ must be dissolved again in a separate work cycle. The impossibility of crystal growth on specific crystal faces and stripe shapes limits the selection of the stripe profile. Selective diffusion makes additional method steps necessary.

SUMMARY OF THE INVENTION

The present invention provides an improved method for manufacturing laser diodes having a buried active layer that avoids undesired layers above the active layer.

To this end, the present invention provides a method for manufacturing a laser diode with a buried active layer and with metal contacts on the opposite sides of the layer format. The method proceeds on the basis of a double hetero-layer structure that contains at least one substrate of a first semiconductor material, an active layer of a second semiconductor material that has a higher refractive index and a smaller energy band gap than the first semiconductor material, and contains an upper layer of the first semiconductor material. The method includes the following steps: (a) a cover layer of a third semiconductor material that will dissolve in super-cooled melts of the first semiconductor material is applied on the double hetero-layer structure on the upper layer; (b) a stripe is defined by laterally etching the cover layer, the upper layer, and the active layer off down into the substrate; and (c) layers of the first semiconductor material are applied, by liquid phase epitaxy, at the side of the stripe at least up to the height of the stripe, whereby the cover layer dissolves.

In a preferred embodiment, InP is employed as the first semiconductor material.

In a preferred embodiment, $In_{1-x}Ga_xAs_yP_{1-y}$ is employed as the third semiconductor material. In a preferred embodiment preferably $1 \leq x \leq 0.35$ and $1 \leq y \leq 0$. In a preferred embodiment, $x=0.35$.

In an embodiment, a layer sequence is applied at the side of the stripe having such dopings that barrier layers are formed at both sides of the active stripe during operation of the laser diode.

In an embodiment of the method of the present invention, the wafer is grown over with a layer upon application of the lateral layers.

In order to improve the contact resistance of the metal contact, in an embodiment of the method of the present invention, a layer of the second semiconductor material is applied under the metal contact at that side of the layer format facing away from the substrate.

In order to improve the lateral current conduction, in an embodiment of the method of the present invention, an insulator layer is applied under the metal contact at the side of the stripe of the active layer being applied at that side of the layer format facing away from the substrate.

The method of the present invention has the advantage that it can be employed on any crystal face and given every stripe profile. Furthermore, the method of the present invention advantageously limits the number of method steps required to produce a laser diode having a buried active layer.

Additional features and advantages of the present invention will be apparent from the detailed description of the presently preferred embodiments and from the drawings.

DETAILED DESCRIPTION OF THE PRESENTLY PREFERRED EMBODIMENTS

Figure 1:
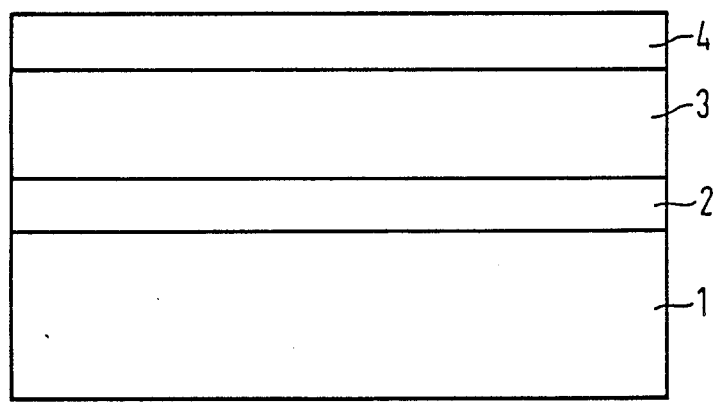
FIG. 1 illustrates a basic laser structure that contains a double hetero-layer structure and a cover layer.

The present invention provides an improved method for manufacturing laser diodes having a buried layer.

The method produces a laser diode with a buried active layer and with metal contacts on the opposite sides of the layer format. The method proceeds on the basis of a double hetero-layer structure that contains at least one substrate of a first semiconductor material, an active layer of a second semiconductor material that has a higher refractive index and a smaller energy band gap than the first semiconductor material, and contains an upper layer of the first semiconductor material. The method includes the following steps: (a) applying a cover layer of a third semiconductor material that will dissolve in a super-cooled melt of the first semiconductor material on the double hetero-layer structure on the upper layer; (b) defining a stripe by laterally etching the cover layer, the upper layer, and the active layer off down into the substrate; and (c) applying, by liquid phase epitaxy, layers of the first semiconductor material at the side of the stripe at least up to the height of the stripe, causing the cover layer to dissolve.

Referring now to the Figures, an active layer 2 of a second semiconductor material is applied on a substrate 1 composed of a first semiconductor material having a first conductivity type. The second semiconductor material can be, for example, InGaAsP, the first semiconductor material can be, for example, InP, and the first conductivity type can be, for example, n-conductive. The second semiconductive material has a higher refractive index and a smaller energy band gap than the first semiconductive material.

Onto the active layer 2, an upper layer 3 of the first semiconductor material having a second conductivity type, is grown. For example, the first semiconductor material can be InP and the second conductivity type can be p-conductive. A cover layer 4 of a third semiconductor material, for example $In_{1-x}Ga_xAs_yP_{1-y}$ having $1 \geq x \geq 0.35$, $1 \geq y \geq 0$, is applied onto the upper layer 3. The third semiconductor material has the property that it dissolves in super-cooled melts of the first semiconductor material.

Figure 2:
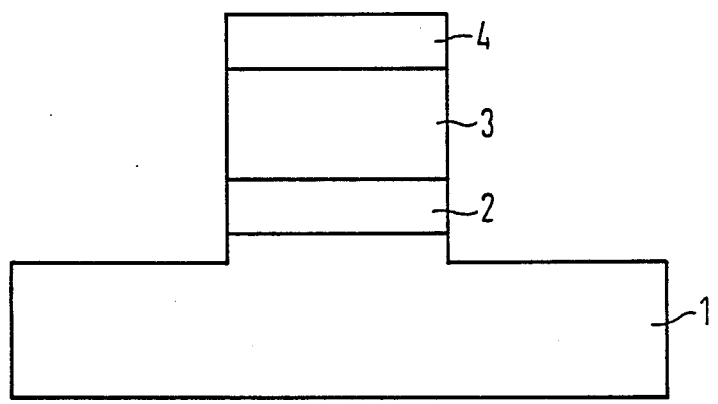
FIG. 2 illustrates a fundamental laser structure on which a stripe was defined by lateral etching.

Referring now to FIG. 2, the stripe shape of the active layer 2 is defined by lateral etching of the cover layer 4, the upper layer 3, and the active layer 2 down into the substrate 1.

Figure 3:
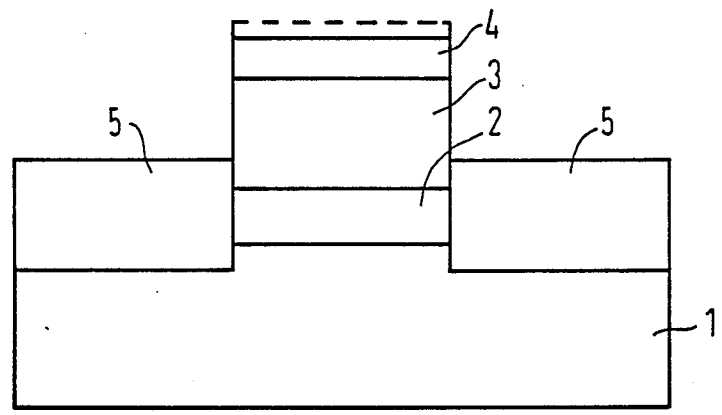
FIG. 3 illustrates a fundamental laser structure after the growth of a first layer at the side of the stripe.

Referring now to FIG. 3, a first semiconductor layer 5 of the first semiconductor material, for example InP, having a second conductivity type, for example p-conductive, is epitaxially applied at the side of the stripe. Since the cover layer 4 is constructed from a material that will dissolve in super-cooled melts of the first semiconductor material, the cover layer 4 is partially re-dissolved upon application of the first semiconductor layer 5.

Figure 4:
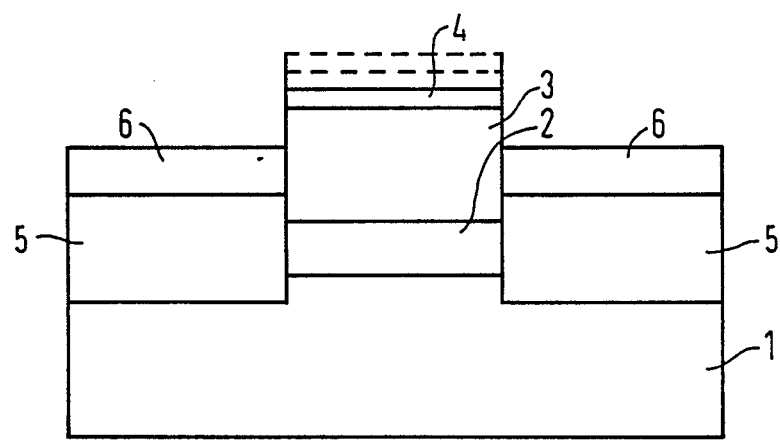
FIG. 4 illustrates a fundamental laser structure after the growth of a second layer at the side of the stripe.

As illustrated in FIG. 4, a second semiconductor layer 6 of the first semiconductor material, for example InP, having the first conductivity type, for example n-conductive, is applied to the first semiconductor layer 5 offset to the side of the stripe. The cover layer 4 is thereby re-dissolved further. The first and second conductivity types are chosen such that a blocking pn-junction forms during operation of the laser diode at the boundary surface between the first semiconductor layer 5 and the second semiconductor layer 6.

A third semiconductor layer 7 of the first semiconductor material, for example InP, having the second conductivity type, for example p-conductive, is applied to the second semiconductor layer 6 to the side of the stripe. As illustrated in FIG. 4, the remainder of the cover layer 4 is thereby completely dissolved.

Figure 5:
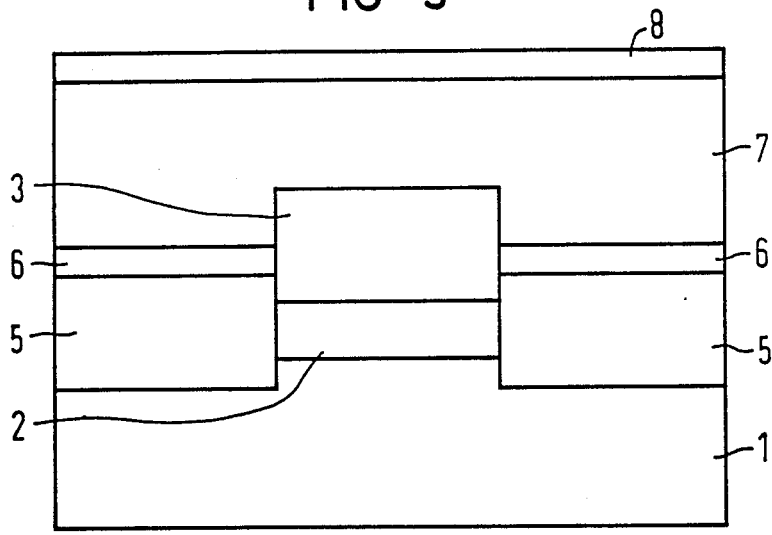
FIG. 5 illustrates a laser diode without contacting.

Referring now to FIG. 5, the third semiconductor layer 7 grows on the wafer surface-wide. It is advantageous for contacting purposes to apply a fourth semiconductor layer 8 of the second semiconductor material, for example InGaAsP, having the second conductivity type, for example p-conductive. The fourth semiconductor layer 8 fulfills the task of diminishing the contact resistance in the contacting of the laser diode. The fourth semiconductor layer 8 is grown on the third semiconductor layer 7 surface-wide.

Figure 6:
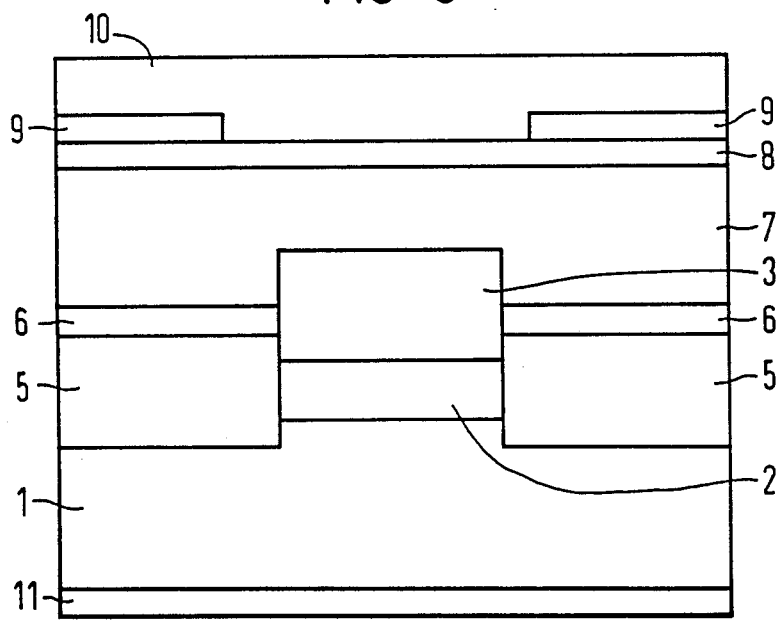
FIG. 6 illustrates a laser diode with insulator layers for lateral current conduction and metal contacts.

Referring now to FIG. 6, in order to further improve the lateral current conduction, an insulator layer 9 is applied to the side of the stripe. A metal contact 10 is then applied to the insulator layer 9 and to the exposed, fourth semiconductor layer 8. The metal contact 10 is conductively connected to the fourth semicondcutor layer 8 only in the region of the stripe since the metal contact 10 is separated from the fourth semiconductor layer 8 by the insulator layer 9 outside of the stripe. The current injection is thereby already limited to the region of the stripe-shaped, active layer 2.

As illustrated, the side of the substrate 1 facing away from the layer format is provided with a metal contact 11.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A method for manufacturing a laser diode with buried active layer and with metal contacts on the opposite sides of the layer format, proceeding on the basis of a double heterolayer structure that contains at least one substrate of a first semiconductor material, an active layer of a second semiconductor material that has a higher refractive index and a smaller energy band gap than the first semiconductor material, and contains an upper layer of the first semiconductor material, comprising the following steps: (a) applying a cover layer of a third semiconductor material that will dissolve in super-cooled melts of the first semiconductor material on the double hetero-layer structure on the upper layer; (b) defining a stripe by laterally etching the cover layer, the upper layer, and the active layer off down into the substrate; and (c) applying, by liquid phase epitaxy, a plurality of layers of the first semiconductor material at the side of the stripe at least up to the height of the stripe, causing the cover layer to dissolve.

2. The method of claim 1 wherein:
InP is employed as first semiconductor material; and $In_{1-x}Ga_xAs_yP_{1-y}$ is employed as the third semiconductor material.

3. The method of claim 2 wherein x and y are such that:

$$1 \geq x \geq 0.35; \text{ and}$$

$$1 \geq y \geq 0.$$

4. The method of claim 1 wherein a layer sequence is applied at the side of the stripe having such dopings that barrier layers are formed at both sides of the active stripe during operation of the laser diode.

5. The method of claim 1 wherein the wafer is grown over with a layer upon application of the lateral layers.

6. The method of claim 1 including the step of improving contact resistance of the metal contact by applying a layer of the second semiconductor material under the metal contact at that side of the layer format facing away from the substrate.

7. The method of claim 1 including the step of improving lateral current conduction by applying an insulator layer under the metal contact at the side of the stripe of the active layer, being applied at that side of the layer format facing away from the substrate.

8. The method of claim 1 wherein three layers are applied by liquid phase epitaxy.

9. A method for manufacturing a laser diode with buried active layer and with metal contacts on the opposite sides of the layer format comprising:
   providing a double hetero-layer structure that contains at least one substrate of a first semiconductor material, an active layer of a second semiconductor material that has a higher refractive index and a smaller energy band gap than the first semiconductor material, and contains an upper layer of the first semiconductor material;
   applying a cover layer of a third semiconductor material that will dissolve in super-cooled melts of the first semiconductor material on the double hetero-layer structure on the upper layer;
   defining a stripe by laterally etching the cover layer, the upper layer and the active layer off down into the substrate; and
   applying, by liquid phase epitaxy, a plurality of layers of the first semiconductor material at the side of the stripe at least up to the height of the stripe, causing the cover layer to dissolve.

10. The method of claim 9 wherein:
InP is employed as first semiconductor material; and $In_{1-x}Ga_xAs_yP_{1-y}$ is employed as third semiconductor material, x and y being such that $1 \geq x \geq 0.35$ and $1 \geq y \geq 0$.

11. The method of claim 9 wherein a layer sequence is applied at the side of the stripe having such dopings that barrier layers are formed at both side of the active stripe during operation of the laser diode.

12. The method of claim 9 wherein the wafer is grown over with a layer upon application of the lateral layers.

13. The method of claim 9 including the step of improving contact resistance of the metal contact by applying a layer of the second semiconductor material under the metal contact at that side of the layer format facing away from the substrate.

14. The method of claim 9 including the step of improving lateral current conduction by applying an insulator layer under the metal contact at the side of the stripe of the active layer, being applied at that side of the layer format facing away from the substrate.

15. The method of claim 9 wherein three layers are applied by liquid phase epitaxy.

* * * * *